US010724133B2

(12) United States Patent
Neal et al.

(10) Patent No.: US 10,724,133 B2
(45) Date of Patent: *Jul. 28, 2020

(54) EBPVD COLUMNATED VAPOR STREAM

(71) Applicant: United Technologies Corporation, Farmington, CT (US)

(72) Inventors: James W. Neal, Ellington, CT (US); Michael J. Maloney, Marlborough, CT (US); Kevin W. Schlichting, South Glastonbury, CT (US); Eric Jorzik, Montgomery, NY (US); David A. Litton, West Hartford, CT (US)

(73) Assignee: Raytheon Technologies Corporation, Farmington, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 15/265,102

(22) Filed: Sep. 14, 2016

(65) Prior Publication Data

US 2018/0073129 A1 Mar. 15, 2018

(51) Int. Cl.
*C23C 14/30* (2006.01)
*C23C 14/24* (2006.01)
*C23C 14/22* (2006.01)
*C23C 14/54* (2006.01)
*H01J 37/305* (2006.01)

(52) U.S. Cl.
CPC ........... *C23C 14/30* (2013.01); *C23C 14/228* (2013.01); *C23C 14/243* (2013.01); *C23C 14/543* (2013.01); *H01J 37/3053* (2013.01)

(58) Field of Classification Search
CPC .......... H01J 37/3053; H01J 2237/1503; H01J 2237/1518; H01J 2237/1526; C23C 14/243; C23C 14/30

USPC ............... 427/566, 567; 118/723 EB, 726; 219/121.15–121.17, 121.33
See application file for complete search history.

(56) References Cited

U.S. PATENT DOCUMENTS

| 3,620,815 A | 11/1971 | Blecherman et al. |
| 5,534,314 A * | 7/1996 | Wadley ............... C23C 14/0021 118/723 FE |
| 5,635,087 A * | 6/1997 | Schiller ................... C23C 14/10 204/298.16 |
| 5,736,073 A * | 4/1998 | Wadley ..................... B22F 9/12 264/10 |

(Continued)

FOREIGN PATENT DOCUMENTS

EP 2261387 A1 12/2010

OTHER PUBLICATIONS

Bruce Mahan, University Chemistry, third Edition; Addison-Wesley publishing company; Reading, Massachusetts, USA; 1975 (no month), excerpt pp. 41-47.*

(Continued)

*Primary Examiner* — Marianne L Padgett
(74) *Attorney, Agent, or Firm* — Bachman & LaPointe, P.C.

(57) ABSTRACT

An electron beam vapor deposition process for depositing coatings includes placing a source coating material in a crucible of a vapor deposition apparatus; energizing the source coating with an electron beam raster pattern that delivers a controlled power density to the material in the crucible forming a vapor cloud from the source coating material; and depositing the source coating material onto a surface of a work piece.

3 Claims, 4 Drawing Sheets

(56) References Cited

U.S. PATENT DOCUMENTS

| | | | |
|---|---|---|---|
| 7,556,695 B2 | 7/2009 | Strangman et al. | |
| 8,110,043 B2 | 2/2012 | Hass et al. | |
| 8,124,178 B2 | 2/2012 | Hass et al. | |
| 8,419,857 B2 | 4/2013 | Neal | |
| 8,541,069 B2 | 9/2013 | Greenberg et al. | |
| 9,951,630 B2* | 4/2018 | Hass | F01D 5/288 |
| 10,106,882 B2* | 10/2018 | Neal | C23C 14/083 |
| 2005/0255242 A1* | 11/2005 | Hass | C23C 14/04 427/248.1 |
| 2005/0287296 A1* | 12/2005 | Wadley | C23C 14/0688 427/248.1 |
| 2007/0141233 A1* | 6/2007 | Schlichting | C23C 14/246 427/8 |
| 2008/0220177 A1* | 9/2008 | Hass | C23C 14/0021 427/446 |
| 2009/0017217 A1* | 1/2009 | Hass | C23C 14/042 427/446 |
| 2010/0247809 A1* | 9/2010 | Neal | C23C 14/30 427/596 |
| 2010/0263590 A1* | 10/2010 | Kirushko | H01J 37/304 118/708 |
| 2011/0318498 A1* | 12/2011 | Wadley | C23C 14/228 427/458 |
| 2012/0137974 A1 | 6/2012 | Hass et al. | |
| 2012/0282402 A1* | 11/2012 | Neal | C23C 14/30 427/255.5 |
| 2013/0095256 A1* | 4/2013 | Hass | C23C 14/0635 427/578 |
| 2013/0142942 A1* | 6/2013 | Wang | A61B 5/00 427/8 |
| 2013/0202815 A1* | 8/2013 | Hass | C23C 16/06 427/576 |
| 2013/0236659 A1* | 9/2013 | Ernst | C23C 14/16 427/564 |
| 2015/0159492 A1* | 6/2015 | Hass | C04B 41/89 428/448 |
| 2015/0361556 A1* | 12/2015 | Neal | C23C 16/463 427/255.28 |
| 2016/0060748 A1* | 3/2016 | Hazel | C23C 14/228 427/566 |
| 2016/0326628 A1* | 11/2016 | DePalma | C23C 14/083 |
| 2018/0073130 A1* | 3/2018 | Hass | C23C 14/32 |
| 2019/0352768 A1* | 11/2019 | Hazel | C23C 14/30 |

OTHER PUBLICATIONS

Lerner et al., Encyclopedia of Physics, 2nd edition, VCH publishers, Inc., New York; 1991 (no month); excerpt: article by Daniel Bershader "Fluid Physics", pp. 402-410.*

Robert C Weast, PhD, editor; CRC Handbook of Chemistry and Physics, 56th edition; CRC Press; 18901 Cranwood Pkwy., Cleveland, OH 44128; 1975 (no month); excerpt p. F-205.*

European Search Report dated Dec. 12, 2017 for corresponding European Patent Application 17191080.5.

* cited by examiner

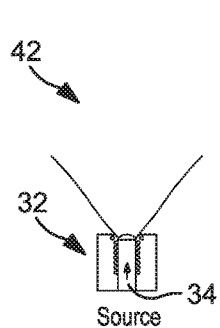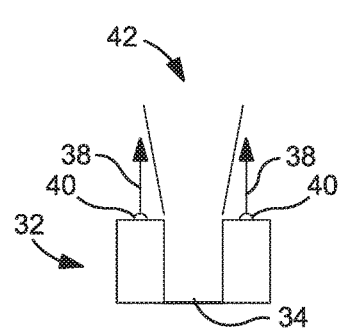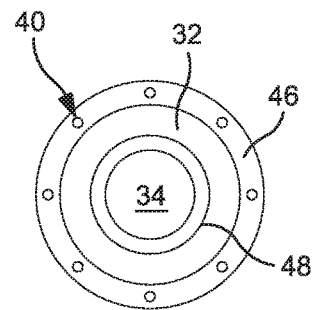
FIG. 3　　FIG. 4　　FIG. 5
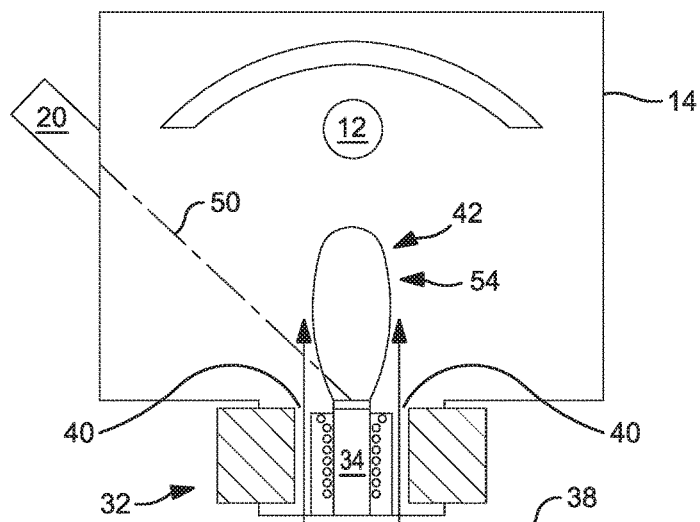
FIG. 6
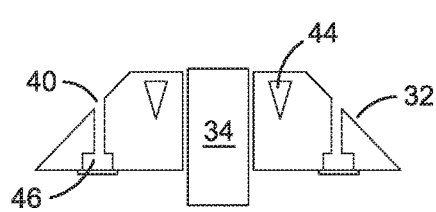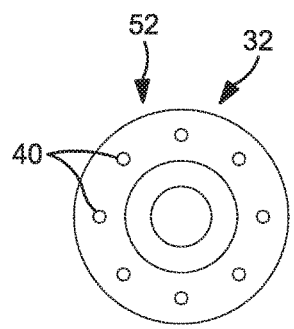
FIG. 7　　FIG. 8

EBPVD COLUMNATED VAPOR STREAM

BACKGROUND

This disclosure relates to an electron beam vapor deposition apparatus and method for depositing coatings with desirable microstructural morphology and orientations on work pieces, and with improved thickness uniformity.

Electron beam vapor deposition devices are known and used for depositing coatings, such as ceramic coatings, onto work pieces. For instance, airfoils for use in turbine engines may include ceramic coatings to protect an underlying metallic alloy from oxidation and corrosion during engine operation. In some instances, there is a desire to form the coating with a columnar microstructure that is generally perpendicular to the underlying surface. The columnar structure increases the durability of the coating. However, available deposition processes are not practically economic or are incapable of depositing a suitable coating with the desired morphology, orientation, and thickness uniformity on all surfaces of a work piece.

Generally, electron beam physical vapor deposition (EB-PVD) involves using an electron beam to melt and evaporate a source coating material. The evaporated material condenses on the work piece. The energy state of the evaporated material, i.e., vapor, can be increased by increasing the electron beam power density in the molten pool of the source coating material.

With certain source coating materials, the temperatures of the underlying base alloy during coating required to ensure desirable columnar coating morphology are undesirably high, e.g., 2050 degrees F. Since the strength of the underlying base alloys are degraded by high temperature exposures, this results in an undesirably narrow processing window for the coating process. Increasing the energy state of the depositing molecules reduces the required temperature of the underlying base alloy during coating.

However, there is an upper limit to the beam power density delivered to the melt pool. Excessive beam power density can result in plasma formation in the coating chamber or in the electron beam guns. The plasma robs power from the beam, which can reduce power delivered into the melt pool. The pool may reduce temperature and may even freeze. When this happens, the cycle can start again resulting in a fluctuating process. The energy state of the vapor formed from the melt pool under these fluctuating conditions varies significantly, resulting in poor morphology of the coating, for some coating compositions. The vapor ions in the EB gun can cause plasma discharges and increased temperature inside the gun. What is needed is to enlarge the process parameter window while improving the process stability to improve the coating structure.

SUMMARY

In accordance with the present disclosure, there is provided an electron beam vapor deposition process for depositing coatings comprising placing a source coating material in a crucible of a vapor deposition apparatus; energizing the source coating with an electron beam raster pattern that delivers a controlled power density to the material in the crucible forming a vapor cloud from the source coating material; and depositing the source coating material onto a surface of a work piece.

In another and alternative embodiment, the controlled power density ranges from about 800 to about 1500 W/cm$^2$.

In another and alternative embodiment, the controlled power density comprises about 1400 W/cm$^2$.

In another and alternative embodiment, the controlled power density comprises about 1100 W/cm$^2$.

In another and alternative embodiment, the process further comprises columnating the vapor cloud to reduce a volume of the vapor cloud.

In another and alternative embodiment, the forming step further comprises directing a process gas through a predetermined pattern of gas jets surrounding the low pressure vapor cloud.

In another and alternative embodiment, the process further comprises propelling the process gas from the gas jets at a sub-sonic velocity.

In accordance with the present disclosure, there is provided a vapor deposition system comprising a coating chamber having a crucible; a source coating material located in the crucible; an electron beam source configured to direct an electron beam raster pattern with controlled power density onto the source coating material; a work piece located in the coating chamber; wherein the low energy electron beam creates a vapor cloud to form a columnar coating on the work piece in the absence of plasma discharge in the coating chamber and/or electron beam source.

In another and alternative embodiment, the controlled power density ranges from about 800 to about 1500 W/cm$^2$.

In another and alternative embodiment, the controlled power density comprises about 1400 W/cm$^2$.

In another and alternative embodiment, the vapor deposition system further comprises a predetermined pattern of gas jets formed in the crucible configured to propel a process gas that surrounds the vapor cloud forming a columnar shape.

In another and alternative embodiment, the vapor deposition system further comprises a predetermined pattern of gas jets formed in a manifold surrounding the crucible configured to propel a process gas that surrounds the vapor cloud forming a columnar shape.

In another and alternative embodiment, the gas jets discharge the process gas at a sub-sonic velocity.

In another and alternative embodiment, the gas jets discharge the process gas at a sub-sonic velocity.

In another and alternative embodiment, the vapor deposition system further comprises a gas manifold formed in the crucible configured to supply the gas jets with the process gas and oriented so as to provide additional energy to the vapor cloud, enabling columnar coating structures at lower temperatures, pressures, and pool power density.

In another and alternative embodiment, the vapor deposition system further comprises a gas manifold formed in the coating chamber distally from the crucible configured to supply the gas jets with the process gas and oriented so as to provide additional energy to the vapor cloud, enabling columnar coating structures at lower temperatures, pressures, and pool power density.

Other details of the electron beam vapor deposition apparatus and method for depositing coatings are set forth in the following detailed description and the accompanying drawing wherein like reference numerals depict like elements.

BRIEF DESCRIPTION OF THE DRAWINGS

FIG. 3 illustrates an exemplary vapor cloud.

FIG. 4 illustrates an exemplary vapor cloud shaped by a gas stream.

FIG. 5 illustrates a top view of an exemplary manifold encircling a crucible/source material of FIG. 4.

FIG. 6 illustrates and exemplary electron beam vapor deposition apparatus.

FIG. 7 illustrates an exemplary crucible.

FIG. 8 illustrates a top view of the exemplary crucible of FIG. 7.

DETAILED DESCRIPTION

Figure 1:
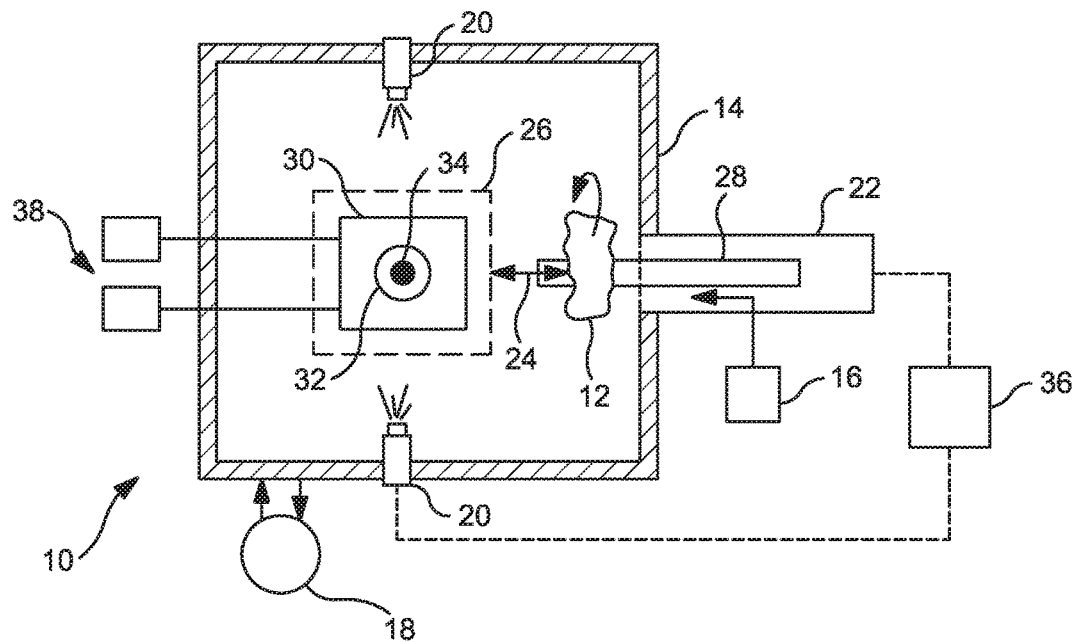
FIG. 1 illustrates an exemplary electron beam vapor deposition apparatus.

FIGS. 1 and 6 illustrate selected portions of an example electron beam vapor deposition apparatus 10 (hereafter "the deposition apparatus 10") for coating a work piece 12 (or work pieces 12), such as airfoils or paired turbine vanes of a gas turbine engine. For instance, the work piece 12 may include surfaces that are difficult to coat with a desired coating thickness and/or microstructural orientation due to the geometry of the work piece 12. That is, the work piece 12 may have angled or curved surfaces and/or surfaces having low exposure relative to another surface. Such is the case with turbine vane segments, for example, which have angled fillet surfaces with the platform and airfoils with a relatively small gap therebetween.

The exemplary deposition apparatus 10 is not limited to use for any particular type of work piece 12. Additionally, the type of coating deposited onto the work piece 12 may be any coating that is suitable for vapor deposition, such as metallic coatings or ceramic coatings. For example, the coating may be a ceramic thermal barrier coating that includes gadolinia, zirconia, yttria, or combinations thereof.

The deposition apparatus 10 includes a coating chamber 14 for containing the work pieces 12 during a coating operation and establishing desirable coating conditions. For instance, the coating chamber 14 may be a vacuum chamber and may include various ports for evacuating the interior or for selectively introducing process gases. A gas source 16 may provide a desired flow of oxygen or other process gas into the coating chamber 14. Optionally, a pump 18 may circulate a coolant (e.g., water) through walls of the coating chamber 14 to control wall temperature.

At least one electron beam source 20, such as an electron gun, is mounted relative to the coating chamber 14 for melting and evaporating a source coating material 34, such as an ingot. In the disclosed example, two electron beam sources 20 are shown; however, the deposition apparatus 10 may alternatively include a single electron beam source 20 or more than two electron beam sources 20. Given this description, one of ordinary skill in the art will recognize an appropriate number of the electron beam sources 20 to meet their particular needs.

A transport 22 is configured to hold and move the work piece 12 back and forth in direction 24 to move the work piece 12 in and out of the coating chamber 14 and in and out of a coating zone 26 where the work piece 12 is to be coated. For instance, the coating zone 26 may be the spatial volume in the coating chamber 14 where the work piece 12 is coated.

In this example, the transport 22 includes a shaft 28 that may be adapted to receive one or more fixtures that hold one or more of the work pieces 12. The shaft 28 may be translated in a known manner using a motor, actuator, or the like.

A coating device 30 is located near the coating zone 26, such as below the coating zone 26, and includes at least one crucible 32 for presenting at least one source coating material 34 that is to be deposited onto the work piece 12. For instance, the coating device 30 may include a single crucible that is used for different deposition modes of the deposition apparatus 10. A desirable stand-off distance may be established between the coating device 30 and the coating zone 26 and/or work piece 12, depending on the geometry of the work piece 12, settings of the electron beam source(s) 20, and other factors.

Optionally, the deposition apparatus 10 may also include a thermal hood (not shown) arranged near the coating zone 26 to facilitate temperature control. As an example, one thermal hood is disclosed in application co-pending and commonly-owned Ser. No. 12/196,368 entitled "DEPOSITION APPARATUS HAVING THERMAL HOOD" which is hereby incorporated by reference.

A controller 36 is in communication with the transport 22 and, optionally, the electron beam source 20 and possibly other components of the deposition apparatus 10 to control the operation thereof. The controller 36 may include software, hardware, or both for operating the deposition apparatus 10. The controller 36 may be configured to control movement of the work piece 12 in and out of the coating chamber 14 into the coating zone 26 and movement of the work piece 12 within the coating zone 26 during a coating operation. A deposition gas source(s) 38 is coupled to the crucible 32 and provides deposition gas.

Figure 2:
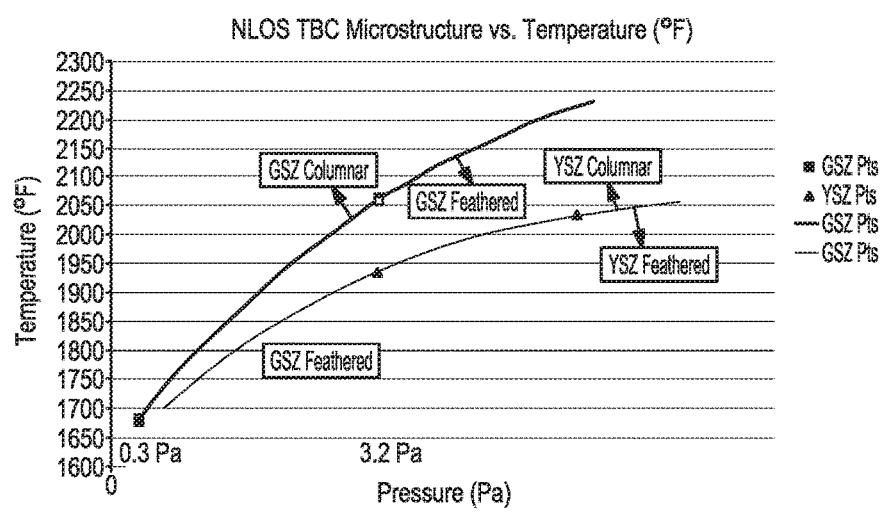
FIG. 2 is a graph illustrating temperature and pressure effects on gadolinia stabilized zirconia and yttria stabilized zirconia microstructures at a certain vapor energy state.

Referring to the FIG. 2, graph that approximates temperature and pressure effects on Gadolinia Stabilized Zirconia (GSZ) and Yttria Stabilized Zirconia (YSZ) microstructures at a certain vapor energy state.

The upper curve is GSZ and the lower curve is YSZ. The curves converge at around 0.3 Pascal pressure, and diverge as pressure is increased. The resulting GSZ and YSZ coating microstructures change from a columnar structure to feathered columns on either side of their respective curve. The parameters in the area above both curves produce columnar structures on both species. Below both curves feathered structures are generated. Between the curves columnar YSZ and feathered GSZ are produced. The structure changes are hypothesized to be related to molecular volume of each material and vapor particle energy.

The process parameter window can be enlarged to avoid plasma generation to stabilize the process to improve the coating structure by decreasing the power density in the source coating material melt pool. In an exemplary embodiment, for source coating materials of Gadolinia Stabilized Zirconia (GSZ) and Yttria Stabilized Zirconia (YSZ) compositions the power density in the pool can be decreased from about 2600 W/cm$^2$ to as low as 800 W/cm$^2$. In another exemplary embodiment the energy in the pool can be decreased from about 2600 W/cm$^2$ to about 1400 W/cm$^2$. In another exemplary embodiment the energy can be decreased from approximately 2600 W/cm$^2$ to about 1100 W/cm$^2$.

The pressure during the coating process can be controlled to improve the coating structure. In an exemplary coating process, such as the example above, for source coating materials of Gadolinia Stabilized Zirconia (GSZ) and Yttria Stabilized Zirconia (YSZ) compositions, the pressure can be reduced from 6 Pa to about 3 Pa.

Referring to FIGS. 3-6, in an exemplary embodiment, gas jets 40 can be incorporated into the crucible 32. The gas jets 40 distribute a sub-sonic jet of process gas 38. The process gas 38 propelled from the gas jets 40 shape the vapor cloud 42 and direct the vapor cloud 42 toward the work piece 12. This is because the orientation of the gas jets 40 is in the direction of the workpiece 12. Thus collisions between process gas molecules and vapor molecules increase the velocity of the vapor molecules in the direction of the workpiece 12. The sub-sonic jet of process gas 38 reduces the adverse effects of the vapor cloud 42 on the electron beam gun 20 and has less of an impact on the coating thickness distribution on coated surfaces, as compared to the use of super-sonic jets.

The FIG. 4 shows an exemplary low vacuum operation vapor cloud 42 columnated by the injected gas 38. The oriented process gas reduces the expansion of the vapor cloud above the melt pool. This reduces the volume of the vapor cloud, increasing the partial pressure of the vapor in the vapor cloud.

FIGS. 5 and 6 show the exemplary crucible 32 equipped with the gas jets 40 and a gas manifold 46 supplying the process gas 38 to the gas jets 40. A beam pattern 48 from the electron beam 50 can be seen as larger in diameter than the source coating material ingot 34. The beam pattern 48 has a diameter less than the diameter of the crucible 32. In an exemplary embodiment, the manifold 46 with gas jets 40 can have a diameter of 160% larger than the beam pattern 48 or source coating material ingot 34 to avoid interaction of the beam pattern with the process gas and to avoid coating of the manifold by inadvertent overflow of the melt pool, which occurs commonly.

FIGS. 7 and 8 further illustrate an exemplary embodiment of incorporating gas jets 40 into the body of the crucible 32. FIG. 7 shows a liquid cooled crucible 32 with liquid cooling channels 44. The crucible 32 includes the gas manifold 46 that supplies the individual gas jets 40. The gas jets 40 are arranged coaxially in a pattern 52 to ensure uniform interaction with the vapor cloud, to columnate the vapor cloud. The diameter of the orifices in the gas manifold are sized to avoid clogging by inadvertent overflow of the melt pool or backscattered deposition. Since the process gas velocity is subsonic, the orifice size is not critical. Typical process gas flowrates range from 1 to 10 slpm, preferably 3 to 6 slpm. Process gas compositions include oxygen, argon, and helium, or mixtures of these gases.

Figure 9:
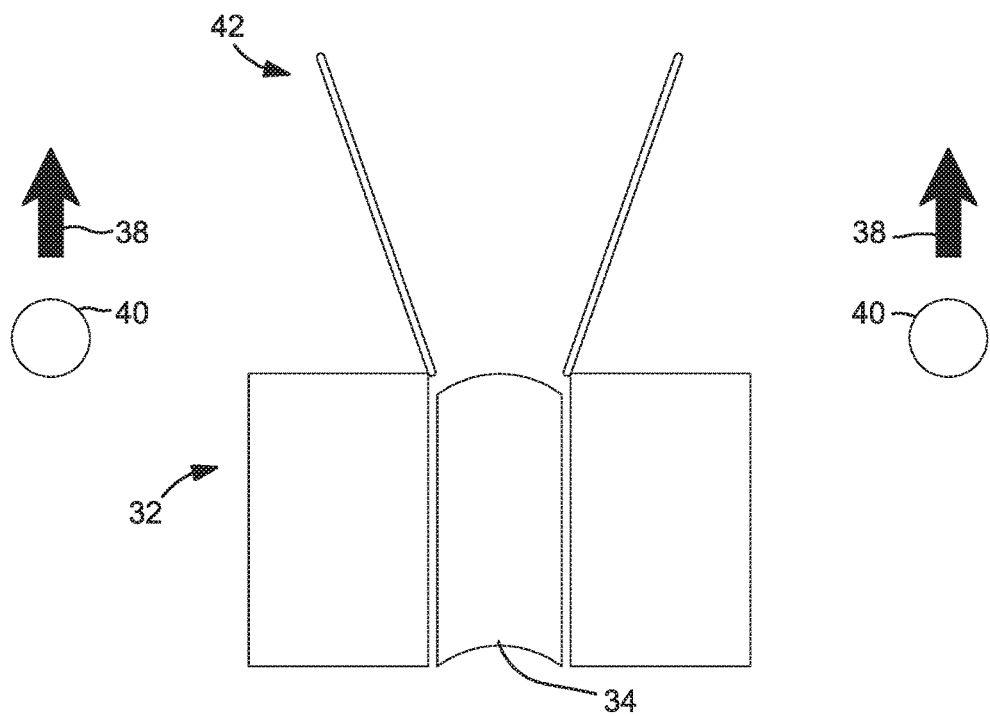
FIG. 9 illustrates an exemplary vapor cloud shaped by a gas stream.
Figure 10:
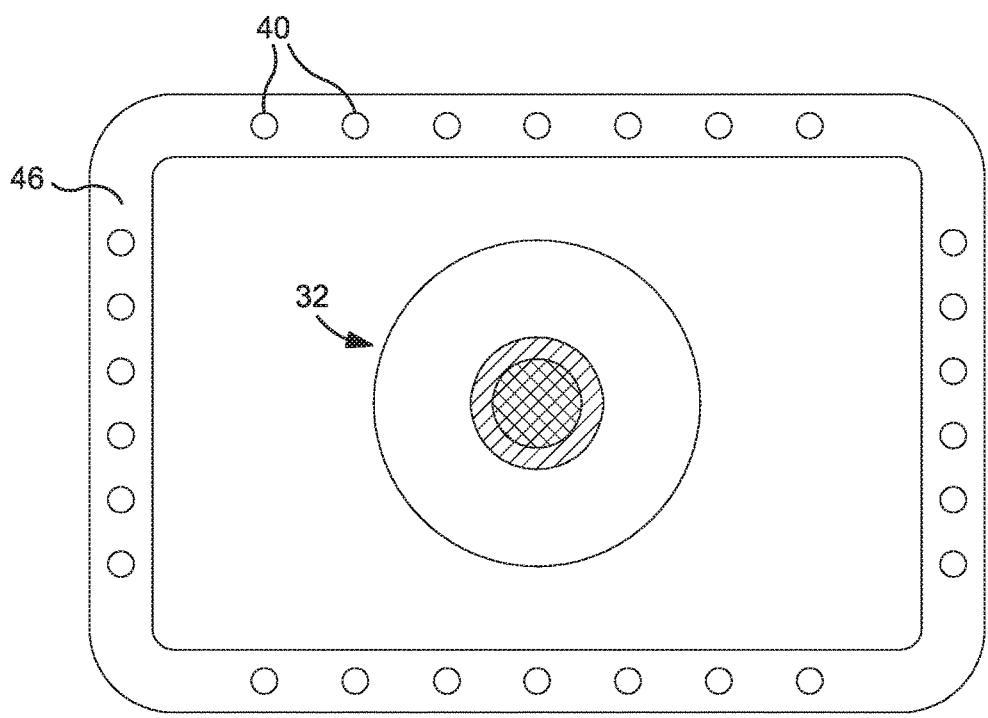
FIG. 10 illustrates a top view of an exemplary manifold distally located encircling the crucible of FIG. 9.
Figure 11:
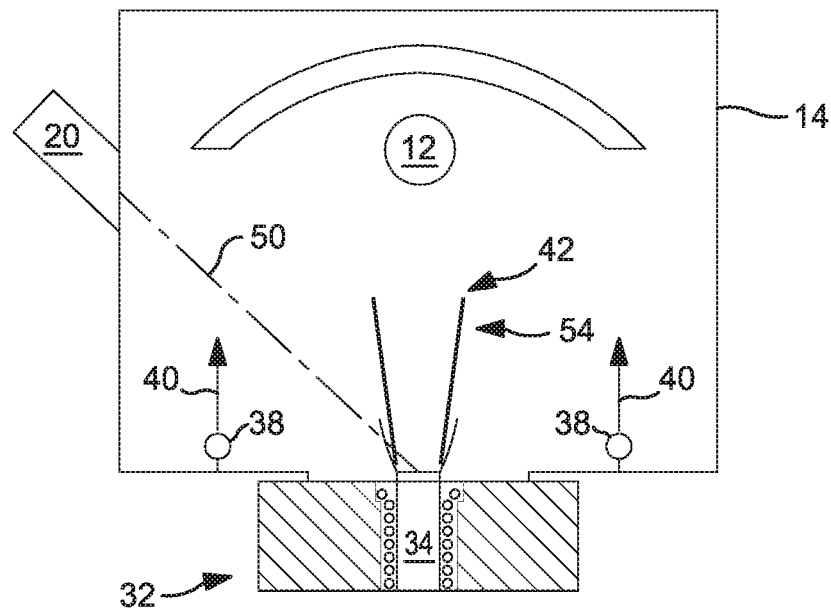
FIG. 11 illustrates an exemplary electron beam vapor deposition apparatus.

FIGS. 9 to 11 show an alternate embodiment of the process gas manifold 46. In this embodiment, the process gas manifold 46 is located away from the crucible 32. The process gas jets 40 are still oriented in the direction of the workpiece 12. This embodiment has the advantage of not needing to be cooled to avoid damage to the gas manifold by the electron beam pattern and the high heat of the deposition process. This embodiment also avoids problems due to inadvertent overflow of the melt pool.

Figure 12:
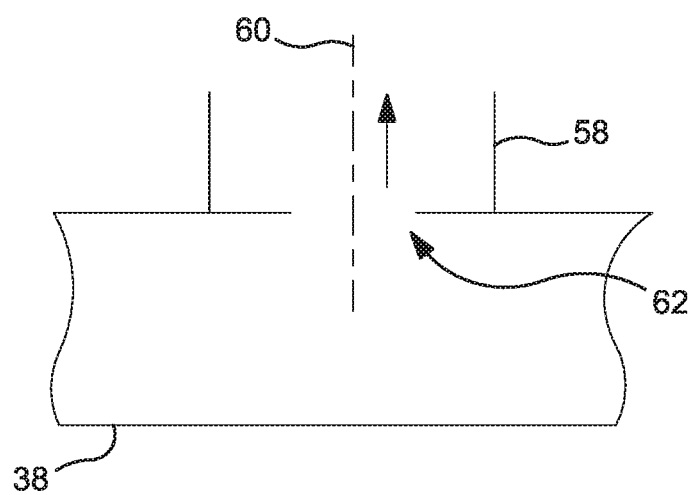
FIG. 12 illustrates an exemplary manifold with a tube and orifice.

FIG. 12 shows another embodiment of the gas manifolds shown in FIGS. 5, 8, and 10. A tube 58 is welded to the process gas manifold 38 such as a longitudinal axis 60 of the tube is coaxial with an orifice 62 that is drilled in the process gas manifold 38. The diameter of the tube 58 is at least 2× the diameter of the orifice 62, and the length of the tube 58 is at least 5× the diameter of the tube 58. These tubes 58 prevent clogging of the orifices 62 by backscattered vapor molecules or inadvertent overflow of the melt pool.

The use of the gas jets 40 provide additional energy to the vapor molecules, enabling columnar coating microstructures at lower temperatures, pressures, and pool power density.

The gas jet streams 40 reduce the cycle time of the process to meet a target thickness distribution on the parts.

The gas jet streams may also improve coating thickness uniformity on complex-shaped parts such as vane clusters.

The advantages of the exemplary deposition apparatus is that by reducing the power density in the melt pool of the source coating material, process fluctuation is avoided, which promotes the formation of desirable columnar coating microstructures.

There has been provided an electron beam vapor deposition apparatus and method for depositing coatings. While the electron beam vapor deposition apparatus and method for depositing coatings has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An electron beam vapor deposition process for depositing coatings comprising the steps of:
   placing a source coating material in a crucible of a vapor deposition apparatus;
   energizing said source coating material with an electron beam raster pattern that delivers a controlled power density that ranges from 800 to 1500 W/cm$^2$ to a melt pool of the source coating material in the crucible;
   wherein the controlled power density delivered avoids plasma formation in a coating chamber of the vapor deposition apparatus and in an electron beam gun used to provide the electron beam raster pattern;
   forming a vapor cloud from said source coating material;
   supplying a process gas to a predetermined pattern of gas jets surrounding said vapor cloud;
   directing said process gas through said predetermined pattern of gas jets surrounding said vapor cloud;
   propelling said process gas from said predetermined pattern of gas jets at a sub-sonic velocity so as to collimate said vapor cloud, thus reducing a volume of said vapor cloud, and thus increasing a partial pressure of vapor in said vapor cloud;
   supplying the process gas to said predetermined pattern of gas jets through a manifold configured with a diameter of 160% larger than the electron beam raster pattern or source coating material ingot to avoid an interaction of the electron beam raster pattern with the process gas and to avoid coating the manifold by inadvertent overflow of the melt pool;
   directing said collimated vapor cloud toward a workpiece located in said coating chamber of said vapor deposition apparatus; and
   depositing said source coating material from said collimated vapor cloud onto a surface of said workpiece to form a coating without plasma being present.

2. The process according to claim 1, wherein said controlled power density is about 1400 W/cm$^2$.

3. The process according to claim 1, wherein said controlled power density is about 1100 W/cm$^2$.

* * * * *